US012596859B2

(12) United States Patent
Kim et al.

(10) Patent No.: US 12,596,859 B2
(45) Date of Patent: Apr. 7, 2026

(54) CIRCUIT ANALYSIS METHOD, CIRCUIT ANALYSIS DEVICE, AND CIRCUIT ANALYSIS SYSTEM

(71) Applicant: Samsung Electronics Co., Ltd.,
Suwon-si (KR)

(72) Inventors: Kwangsun Kim, Suwon-si (KR);
Hyungjung Seo, Suwon-si (KR)

(73) Assignee: Samsung Electronics Co., Ltd.,
Suwon-si (KR)

( * ) Notice: Subject to any disclaimer, the term of this
patent is extended or adjusted under 35
U.S.C. 154(b) by 546 days.

(21) Appl. No.: 18/166,055

(22) Filed: Feb. 8, 2023

(65) Prior Publication Data

US 2024/0070361 A1 Feb. 29, 2024

(30) Foreign Application Priority Data

Aug. 24, 2022 (KR) ........................ 10-2022-0106202

(51) Int. Cl.
*G06F 30/3308* (2020.01)
*G06F 30/20* (2020.01)
(Continued)

(52) U.S. Cl.
CPC .......... *G06F 30/3308* (2020.01); *G06F 30/20*
(2020.01); *G06F 30/367* (2020.01); *G06F*
*30/398* (2020.01)

(58) Field of Classification Search
CPC .... G06F 30/3308; G06F 30/20; G06F 30/367;
G06F 30/398
(Continued)

(56) References Cited

U.S. PATENT DOCUMENTS 7,661,050 B2 2/2010 Huben et al.
8,650,513 B2 2/2014 Salz et al.
(Continued)

FOREIGN PATENT DOCUMENTS

CN 103577672 B * 12/2016 .......... G06F 30/327
CN 106326553 A * 1/2017 .......... G06F 30/327
(Continued)

OTHER PUBLICATIONS

Wang et al., Chinese Patent Document No. CN-103577672-A,
published Feb. 12, 2014, 3 pages including abstract, claims and 1
drawing. (Year: 2014).*
(Continued)

*Primary Examiner* — Phallaka Kik
(74) *Attorney, Agent, or Firm* — Wolf, Greenfield &
Sacks, P.C.

(57) ABSTRACT

Provided are a circuit analysis method, a circuit analysis
device, and a circuit analysis system. An embodiment pro-
vides a circuit analysis method, including: building a circuit
graph based on a netlist of a circuit; defining a node in the
circuit graph; extracting an X (unknown) event for each
node based on a waveform built as a result of simulation for
the node; building an X event node from the X event that
was extracted; building an X event graph by linking the X
event node to at least one other X event node; traversing the
X event graph and identifying a source X event and an
involvement X event; and finding an X propagation path for
the X event node, the X propagation path comprising the
source X event and the involvement X event.

20 Claims, 7 Drawing Sheets

(51) Int. Cl.
  *G06F 30/367* (2020.01)
  *G06F 30/398* (2020.01)
(58) Field of Classification Search
  USPC ............... 716/106, 103, 105, 111, 112, 136; 703/16, 17
  See application file for complete search history.

(56) References Cited

U.S. PATENT DOCUMENTS

| | | | |
|---|---|---|---|
| 8,775,987 B1* | 7/2014 | Donlin | G06F 30/30 716/106 |
| 8,813,005 B1* | 8/2014 | Dao | G06F 30/33 716/136 |
| 9,875,327 B2 | 1/2018 | Beerel et al. | |
| 9,887,804 B2 | 2/2018 | Birrittella | |
| 10,325,042 B1 | 6/2019 | Sharma et al. | |
| 10,521,535 B2 | 12/2019 | Oriordan et al. | |
| 2002/0032889 A1 | 3/2002 | Ghosh | |
| 2003/0126570 A1 | 7/2003 | Du et al. | |
| 2005/0091025 A1* | 4/2005 | Wilson | G06F 30/3323 703/16 |
| 2006/0053357 A1 | 3/2006 | Rajski et al. | |
| 2006/0069958 A1 | 3/2006 | Sawicki et al. | |
| 2008/0071515 A1* | 3/2008 | Bhadra | G06F 30/3312 703/16 |
| 2009/0063572 A1* | 3/2009 | Li | G06F 11/3604 |
| 2009/0210183 A1 | 8/2009 | Rajski et al. | |
| 2010/0100781 A1 | 4/2010 | Wohl et al. | |
| 2013/0268817 A1 | 10/2013 | Wohl et al. | |
| 2013/0326281 A1 | 12/2013 | Xu et al. | |
| 2016/0070844 A1* | 3/2016 | Shyamsukha | G06F 30/337 716/113 |

FOREIGN PATENT DOCUMENTS

| | | | | |
|---|---|---|---|---|
| CN | 114841103 A | * | 8/2022 | G06F 30/327 |
| JP | H0418679 A | * | 1/1992 | |
| JP | H10162036 A | * | 6/1998 | |
| JP | 2002-049655 A | | 2/2002 | |
| JP | 2007-536673 A | | 12/2007 | |
| JP | 2008-516305 A | | 5/2008 | |
| JP | 2010-539518 A | | 12/2010 | |
| JP | 2012-230131 A | | 11/2012 | |

OTHER PUBLICATIONS

Gao et al., Chinese Patent Document No. CN-114861577-A, published Aug. 5, 2022, 3 pages including abstract, claims and 1 drawing. (Year: 2022).*

* cited by examiner

1

Report

| Source X Event | Involvement X Event | X Propagation Path |
|---|---|---|
| a1 | b1, c1, d1, e1, f1, g1 | a1→b1→c1→d1→e1→f1→g1<br>a1→b1→c1→d1→f1→g1 |
| a2 | b2, c2 | a2→b2→c2 |

CIRCUIT ANALYSIS METHOD, CIRCUIT ANALYSIS DEVICE, AND CIRCUIT ANALYSIS SYSTEM

CROSS-REFERENCE TO RELATED APPLICATION

This application claims priority to and the benefit of Korean Patent Application No. 10-2022-0106202 filed in the Korean Intellectual Property Office on Aug. 24, 2022, the entire contents of which are incorporated herein by reference.

FIELD

The present disclosure relates to a circuit analysis method, a circuit analysis device, and a circuit analysis system.

BACKGROUND

X (unknown) is a value that may refer to an intermediate state between logic 0 and logic 1 in semiconductor circuit design, and may indicate a case in which an exact circuit state, which may be logic 0 or logic 1 depending on a situation, is unknown. X may adversely affect operation of a circuit by causing a gate configuring the circuit to operate with an unintended function, and when a pull-up logic and a pull-down logic are simultaneously turned on to build a DC path, it may cause excessive power consumption. In addition, an unexpected value may be generated and propagated due to a failure in securing a timing margin between control logic.

SUMMARY

An objective to be solved is to provide a circuit analysis method, a circuit analysis device, and a circuit analysis system that may provide efficient analysis on causes of X propagation that may occur during semiconductor circuit design.

An embodiment provides a circuit analysis method, including executing, by a processor, computer readable program instructions embodied in a non-transitory memory to perform operations comprising: building a circuit graph based on a netlist of a circuit; defining a node in the circuit graph; extracting an X event for the node based on a waveform built as a result of simulation for the node; building an X event node from the X event that was extracted; building an X event graph by linking the X event node to at least one other X event node; traversing the X event graph and identifying a source X event and an involvement X event; and finding an X propagation path for the X event node, the X propagation path comprising the source X event and the involvement X event.

Another embodiment provides a circuit analysis device, including: a circuit graph building module configured to build a circuit graph based on a netlist of a circuit; an X event extracting module configured to extract an X event based on a waveform built as a result of simulation for a node defined in the circuit graph; an X event linking module configured to build an X event node from the X event that was extracted, and link the X event node to at least one other X event node to build an X event graph; a graph traversing module configured to traverse the X event graph and identify a source X event and an involvement X event; and an X path finding module configured to find an X propagation path for the X event node, the X propagation path comprising the source X event and the involvement X event.

Another embodiment provides a circuit analysis system, including: a netlist database configured to store a netlist of a circuit; a simulation database configured to store a waveform built as a result of simulation for a node defined in the circuit; and a circuit analyzing device. The circuit analyzing device comprises: a circuit graph building module configured to build a circuit graph based on the netlist from the netlist database; an X event extracting module configured to extract an X event for the node based on the waveform from the simulation database; an X event linking module configured to build an X event node from the X event that was extracted, and configured to link the X event node to at least one other X event node to build an X event graph; a graph traversing module configured to traverse the X event graph and configured to identify a source X event and an involvement X event; and an X path finding module configured to find an X propagation path for the X event node, the X propagation path comprising the source X event and the involvement X event.

DETAILED DESCRIPTION OF EMBODIMENTS

Figure 1:
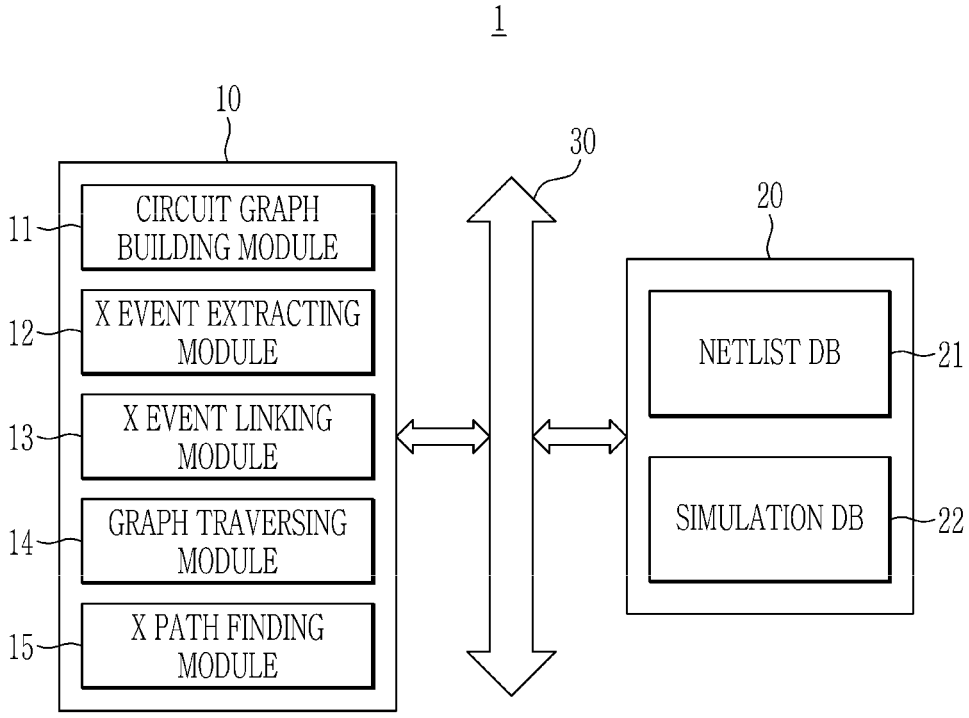
FIG. 1 is a block diagram illustrating a circuit analysis system according to an embodiment.

The present invention will be described more fully hereinafter with reference to the accompanying drawings, in which embodiments of the invention are shown. As understood by those skilled in the art, the described embodiments may be modified in various different ways, all without departing from the scope of the present invention.

Accordingly, the drawings and description are to be regarded as illustrative in nature and not restrictive. Like reference numerals designate like elements throughout the specification.

In addition, a singular form may be intended to include a plural form as well, unless the explicit expression such as "one" or "single" is used. Terms including ordinal numbers such as "first," "second," and the like will be used to describe various constituent elements, and are not to be interpreted as limiting these constituent elements. These terms may be used for a purpose of distinguishing one constituent element from other constituent elements.

In addition, terms such as " . . . part," " . . . portion," "er/or," or "module" disclosed in the present specification may refer to a unit that may process at least one function or operation described in this specification, which may be implemented by hardware, software, or a combination thereof. Computer readable program instructions may be embodied in a memory or other non-transitory storage medium as described herein and may be executed by a processor, module, or other unit to perform one or more functions or operations described herein.

A semiconductor circuit design may start from a register transfer level (RTL) code design that designs a digital circuit using a register and a logic circuit. For example, VHSIC hardware description language (VHDL) coding may be performed at the RTL level, where the VHDL is a hardware description language expressing a digital circuit and a mixed-signal. After designing the RTL code, layout information may be input and synthesis may be performed. A gate level design may be derived through such a process. Logic simulation verification may be performed on the gate level design that may be obtained through such a process, and it may be converted to a transistor level design and static design verification may be performed. This design method has the advantage of being easy to verify in that various software (for example, an electronic design automation (EDA) solution) that may ease the design process and may support verification may be utilized, but may become more challenging with respect to semiconductor chip size increases and circuit tuning.

Unlike the above-described RTL method, semiconductor circuit design may be directly performed at the transistor level. It is a method in which layout information input, logic simulation verification, circuit simulation verification, and the like are performed after the transistor level design is first performed. This design method is suitable for realizing a small size and a flexible and fast operation because an area of the semiconductor chip may be efficiently used. Due to these properties, the transistor level method may be used, for example, in a design of a dynamic random access memory (DRAM) device having a high-speed operation and efficiency as major performance factors.

However, since the logic simulation verification method for the gate level design used in the above-described RTL method is different from the logic simulation verification method for the transistor level design used in the transistor level method, it may be difficult to directly apply the existing EDA solution, so that a demand for automation and efficiency in verification including X propagation analysis is increasing.

Hereinafter, a circuit analysis method, a circuit analysis device, and a circuit analysis system that may be applied to the transistor level method to provide an efficient analysis for a cause of X propagation that may occur when designing a semiconductor circuit will be described with reference to FIG. 1 to FIG. 9.

FIG. 1 is a block diagram illustrating a circuit analysis system according to an embodiment.

Referring to FIG. 1, a circuit analysis system 1 according to an embodiment may include a circuit analysis device 10 and a database 20.

As described above, in the design method in which the transistor level design is directly performed, the circuit analysis device 10 may analyze the cause of X propagation that may occur during the semiconductor circuit design. To this end, the circuit analysis device 10 may include a circuit graph building module 11, an X event extracting module 12, an X event linking module 13, a graph traversing module 14, and an X path finding module 15. The circuit analysis device 10 may be implemented as hardware itself, or may be implemented as software that may be executed in a computing system including a processor and a memory. Of course, only some of the modules configuring the circuit analysis device 10 may be implemented as hardware, and the rest may be implemented as software. That is, modules as described herein may refer to circuits or any combination of hardware and/or software.

The circuit graph building module 11 may build a circuit graph based on a netlist of circuits. The netlist is a file representing the structure of a circuit when designing a semiconductor circuit, and may be provided, for example, in a text format. Specifically, the netlist may include a connection relationship between circuit elements, a connection relationship between functional blocks configured of or implemented by circuit elements, and node information according to connection of circuit elements to describe structure of the circuit. In some embodiments, the netlist may include information on configuration of transistor-type elements and on configuration of nodes to which respective circuit elements are connected.

The circuit graph may be a graph-type data structure built by recognizing a circuit configured of or implemented at a transistor level as a unit of digital logic from an operational point of view. Specifically, the circuit graph is built by the circuit graph building module 110 based on the netlist of circuits described with or at the transistor level, and may be a circuit graph expressed with or at the gate level.

In some embodiments, netlist elements corresponding to the transistor level may be grouped into one digital logic from an operational point of view. To do this, in the netlist of circuits corresponding to the transistor level, a gate may be configured by inferring an input/output relationship between transistors and identifying a channel connected block (CCB) including electrical blocks in which channel terminals are electrically connected to each other.

The X event extracting module 12 is configured to define respective nodes in the circuit graph built by the circuit graph building module 11, and may extract an X event for each node based on a waveform built as a result of simulation for the node defined in the circuit graph. Here, the node may be defined by identifying the input and output of the gate configuring the circuit graph. In some embodiments, the simulation result may include a Verilog simulation result.

Meanwhile, the X event may refer to an event in which a value that is an intermediate state between logic 0 and logic 1 occurs (i.e., an unknown logic value). That is, the X event extracting module 12 may analyze the value of the waveform detected as a result of simulation for the nodes of the circuit graph, and if the value is the X value, it may be determined that the X event has occurred in the corresponding waveform. Accordingly, the X event extracting module 12 may extract a section in which the X event occurs from the corresponding waveform, or may extract a time point at which the X event has occurred.

The X event linking module 13 may generate an X event node from the X event extracted by the X event extracting module 12, and may link the X event node to at least one other X event node to build the X event graph. Specifically, a section in which the X event extracted by the X event extracting module 12 occurs may be designated as an X event node, and a time point at which the X event extracted by the X event extracting module 12 occurs may be designated as an X event node. The X event graph may be built by linking the X event nodes designated as described above with a link. In this case, the link between the designated X event nodes may correspond to an edge of the X event graph.

In some embodiments, the edge may be directional. The direction of the edge may be determined in consideration of the input/output relationship of the gate or CCB configuring the circuit graph. For example, the node corresponding to the input of the gate or CCB configuring the circuit graph may be set to have the edge direction in an incoming direction, and the node corresponding to the output of the gate or CCB configuring the circuit graph may be set to have the edge direction in an outgoing direction.

In this way, by forming the link between the X event nodes, it is possible to find the cause of the X event nodes. That is, the X event linking module 13 may link a certain X event node with another X event node that causes an X event of the certain X event node to occur. Here, the other X event node that is the cause may be identified through whether there is a preceding X event for the certain X event node in which the X event has occurred. As described above, the linking of the X event that is the cause may be performed for all X events extracted by the X event extracting module 12.

The graph traversing module 14 may traverse the X event graph built by the X event linking module 13, and may identify a source X event and an involvement X event. Here, the source X event may mean an X event inferred to be a first cause among the identified cause X events. The involvement X event may mean X events that configure a path from the source X event to the final X event, but do not correspond to the source X event.

The graph traversing module 14 may traverse the X event graph, for example, according to a depth first search (DFS) algorithm. Here, the DFS algorithm may be a full search algorithm that searches from a node with a large depth in the graph. The graph traversing module 14 may perform traversal according to the DFS algorithm on an X event node having no input in the X event graph. Embodiments described herein are not limited to only the DFS algorithm as a method for traversing the X event graph; rather, various other search algorithms suitable for specific implementation purposes may be used.

The X path finding module 15 may determine or find an X propagation path for the X event node. Here, the X propagation path may include a list of X events that list the source X event and the involvement X event identified by the graph traversing module 14 to match the linking relationship.

When information about the source X event, the involvement X event, and the X propagation path derived as described above is provided to a user, the user may find out from which node the X event deduced to be the first cause among the identified cause X events occurred without the need to verify all suspected circuit components individually, and analysis of the cause of X propagation that may occur when designing a semiconductor circuit may be provided in an efficient way, thereby providing improvements in comparison to some conventional technologies (e.g., RTL methods) in which the simulation results may not be applied to address X propagation related problems. In some embodiments, a report including the analysis result for the source X event, the involvement X event, and the X propagation path may be built and provided to the user, or a graphical user interface (GUI) tool for analysis may be provided. Accordingly, in comparison to some conventional methods, an analysis turn around time (TAT) may be shortened, and a product design period may be shortened.

In some embodiments, the database 20 may include a netlist database 21 and a simulation database 22. The netlist database 21 may store a netlist of a circuit, and the simulation database 22 may store a waveform built as a simulation result for a node defined in a circuit. Accordingly, the circuit graph building module 11 may build a circuit graph based on the netlist provided from the netlist database 21, and the X event extracting module 12 may extract an X event for each node based on the waveform provided from the simulation database 22.

Figure 2:
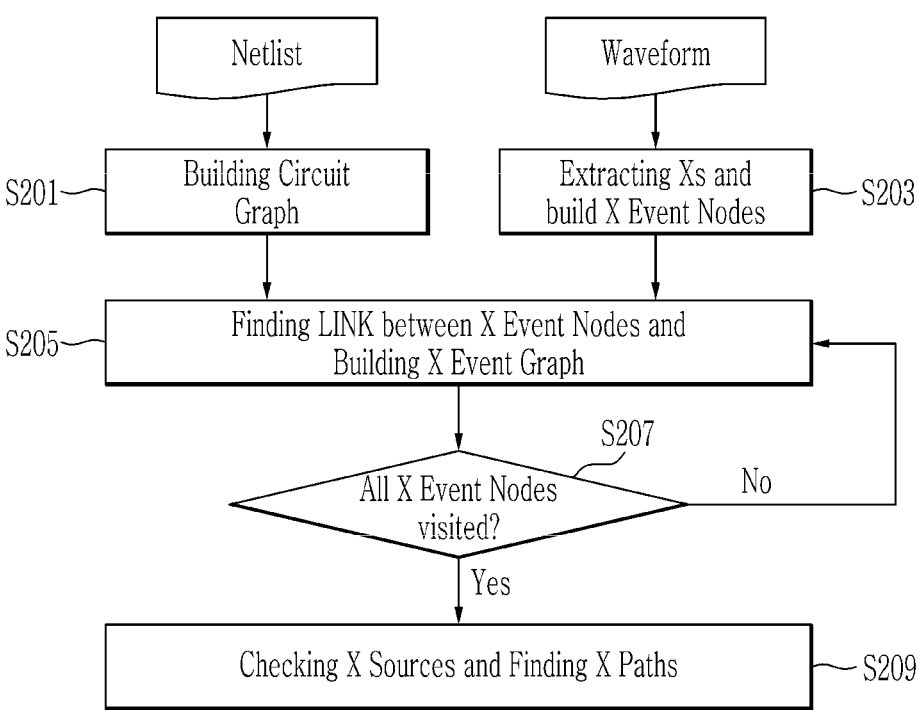
FIG. 2 is a flowchart illustrating a circuit analysis method according to an embodiment.

FIG. 2 is a flowchart illustrating a circuit analysis method according to an embodiment.

Referring to FIG. 2, a circuit analysis method according to an embodiment may build a circuit graph based on a netlist of a circuit in step S201. A node is defined in the circuit graph, and an X event may be extracted for each node based on a waveform built as a result of simulation for a node defined in step S203.

In some embodiments, step S201 may include building a circuit graph represented with a gate level based on a netlist of circuits described with a transistor level.

In some embodiments, step S201 may include inferring an input/output relationship between the transistors from the netlist of the circuit, and configuring a gate by identifying a CCB including an electrical block in which channel terminals are electrically connected to each other.

Next, in step S203, an X event node may be built from the extracted X event, and in step S205 an X event graph may be built by linking the X event node with a link. Then, it is possible to traverse the X event graph and to identify a source X event and an involvement X event.

In some embodiments, step S205 may include extracting a section in which the X event occurs from the waveform.

In some embodiments, step S205 may include linking the X event node, and an X event node causing each X event of the X event node to occur. Here, the X event node that is the cause may be identified through whether there is a preceding X event for the X event node in which the X event has occurred. On the other hand, the linking of the X event node that is the cause may be performed for all the extracted X events.

Next, in step S207, when all the X event nodes are visited, step S209 is performed, and when all the X event nodes are not visited, step S205 is performed, so that the graph traversal of the X events may be continued.

Such traversal may include traversing the X event graph according to the DFS algorithm, and traversal according to the DFS algorithm may be performed on the X event node having no input.

When all the X event nodes are visited, in step S209, the source X event may be checked and the X propagation path to the X event node may be found. Finding or determining the X propagation path as described herein may thereby improve operation of circuit analysis methods, systems, and devices by indicating cause(s) of X propagation, such that problems relating to X propagation may be addressed when designing a semiconductor circuit.

A more detailed description on the circuit analysis method according to the present embodiment may be referred to in the description described above in relation to FIG. 1.

Figure 3:
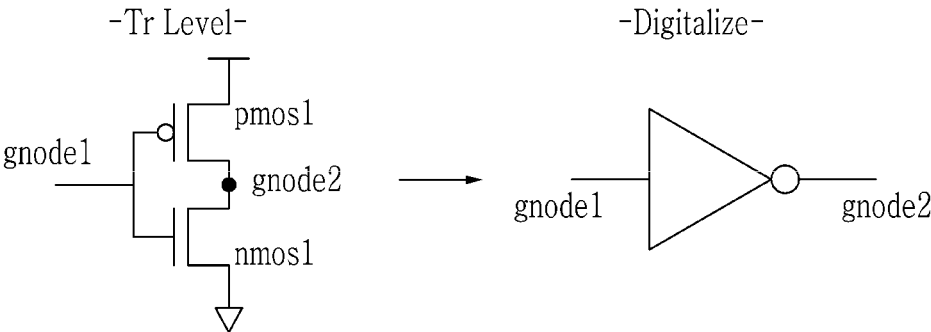
FIG. 3 and FIG. 4 are circuit diagrams illustrating a circuit graph building module according to an embodiment.
Figure 4:
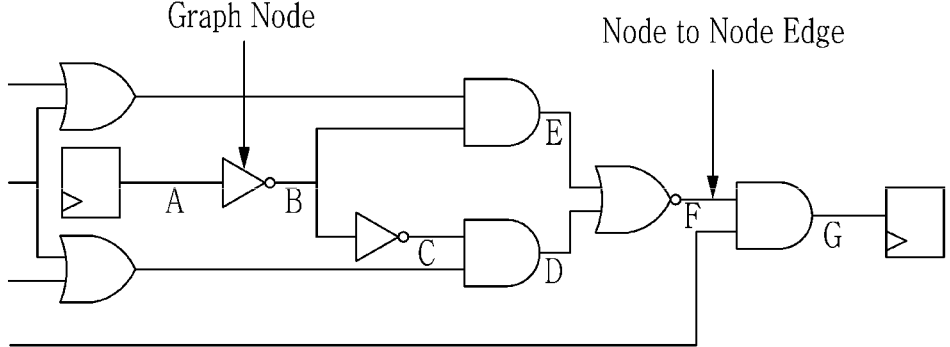

FIG. 3 and FIG. 4 are circuit diagrams illustrating the circuit graph building module according to an embodiment.

Referring to FIG. 3, the circuit graph building module 11 according to the embodiment may digitalize the circuit with the transistor level in terms of operation in order to build the circuit graph expressed with the gate level based on the netlist of the circuit described with the transistor level. For example, a transistor pmos1 and a transistor nmos1 shown at the left side of FIG. 3 have an input gnode1 and an output gnode2, and the transistors pmos1 and nmos1 connected from a power source voltage Vdd to a ground voltage Gnd may be grouped. Accordingly, a NAND logic gate as shown at the right side of FIG. 3 may be configured.

Referring to FIG. 4, the circuit graph building module 11 may build a circuit graph. As shown, the circuit graph includes the gate converted in the manner described with reference to FIG. 3, and an edge may be formed between the nodes. That is, it can be seen that the circuit described with the transistor level is converted into the circuit graph expressed with the gate level. Nodes (A to G) may be defined in at least some of the formed edges.

Figure 5:
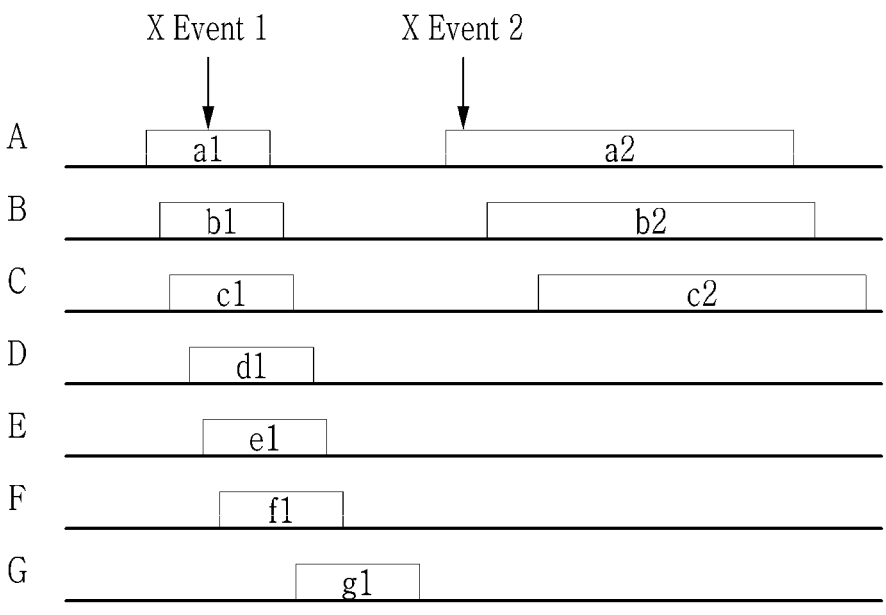
FIG. 5 is a diagram illustrating operation of an X event extracting module according to an embodiment.

FIG. 5 is a diagram illustrating operation of the X event extracting module according to an embodiment.

Referring to FIG. 5, the X event extracting module 12 according to the embodiment is configured to define a node in the circuit graph built by the circuit graph building module 11, and may extract an X event for each node based on a waveform built as a result of simulation for the node defined in the circuit graph. For example, a first X event and a second X event may be extracted based on waveforms corresponding to the node A defined in the circuit graph. Then, an X event node a1 may be built from a first X event, and an X event node a2 may be built from a second X event. In the same manner, X event nodes b1, b2, c1, c2, d1, e1, f1, and g1 may be built.

Figure 6:
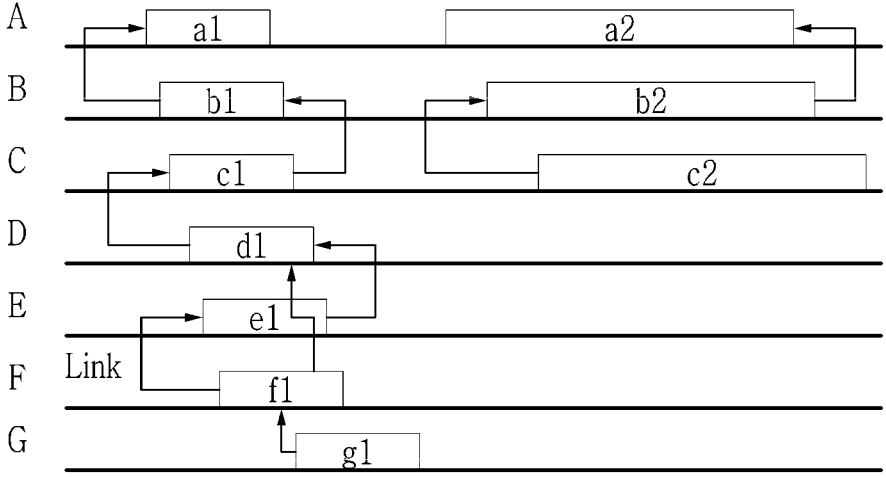
FIG. 6 is a diagram illustrating operation of an X event linking module according to an embodiment.

FIG. 6 is a diagram illustrating operation of the X event linking module according to an embodiment.

Referring to FIG. 6, the X event linking module 13 according to the embodiment may link the X event nodes a1, a2, b1, b2, c1, c2, d1, e1, f1, and g1 with respective links. The respective links may have directionality (designated by arrows).

For example, the X event node g1 may be linked to the X event node f1 by a link, and the link may be set in an outgoing direction from the X event node g1 and in an incoming direction to the X event node f1. Meanwhile, the X event node f1 may be linked to the X event node e1 by a first link, and may be linked to the X event node d1 by a second link. Meanwhile, the X event node c1 may be linked to the X event node b1 and the X event node b1 may be linked to the X event node a1 through respective links, and the X event node c2 may be linked to the X event node b2 and the X event node b2 may be linked to the X event node a2 through respective links.

Figure 7:
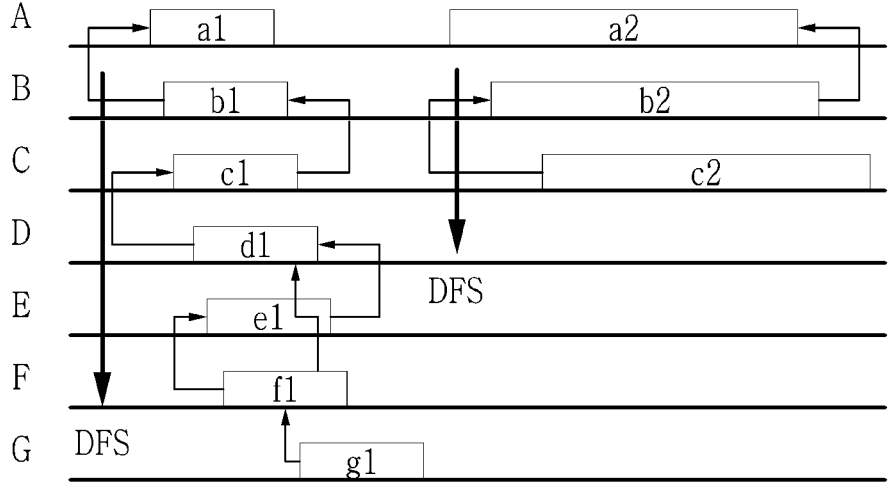
FIG. 7 is a diagram illustrating operation of an X event traversing module according to an embodiment.

FIG. 7 is a diagram illustrating operation of the X event traversing module according to an embodiment.

Referring to FIG. 7, the graph traversing module 14 according to the embodiment may traverse the X event graph built by the X event linking module 13 according to the DFS algorithm, and may identify the source X event and the involvement X event. Here, the source X event may mean an X event deduced to be the first cause among the identified cause X events, that is, the X event a1 and the X event a2. The involvement X event may mean X events, that is, the X events b1, c1, d1, e1, f1, and g1 and the X event b2 and c2 that configure or are linked in the path from the source X event to the final X event, but do not correspond to the source X event. This traversal may be performed according to the DFS algorithm for the X event node with no input. That is, each of the X event nodes a1 and a2 with no input may be traversed according to the DFS algorithm. This traversal iteration may be performed for all the X event nodes having no input.

Figures 8, 9:
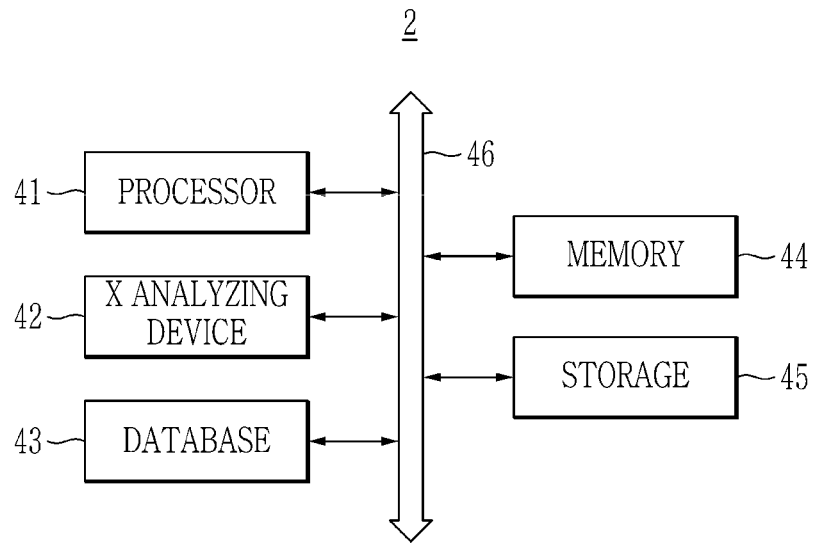
FIG. 8 is a table illustrating output of an X path finding module according to an embodiment.
FIG. 9 is a block diagram illustrating a circuit analysis system according to an embodiment.

FIG. 8 is a table illustrating an example output of the X path finding module according to an embodiment.

Referring to FIG. 8, the X path finding module 15 according to the embodiment may provide information about the derived source X event, the involvement X event, and the X propagation path to the user, for example in a form of a report. From this, the user may efficiently perform verification by only checking two X event nodes a1 and a2 among a total of ten X event nodes a1, a2, b1, b2, c1, c2, d1, e1, f1, and g1.

FIG. 9 is a block diagram illustrating a circuit analysis system according to an embodiment.

Referring to FIG. 9, a circuit analysis system 2 according to an embodiment may include a processor 41, an X analyzing device 42, a database 43, a memory 44, and a storage 45. The processor 41, the X analyzing device 42, the database 43, the memory 44, and the storage 45 may exchange data with each other through a bus 46. Here, the X analyzing device 42 may correspond to the circuit analysis device 10 described above with reference to FIG. 1, and the database 43 may correspond to the database 20 described above with reference to FIG. 1.

While this invention has been described in connection with what is presently considered to be practical embodiments, it is to be understood that the invention is not limited to the disclosed embodiments, but, on the contrary, is intended to cover various modifications and equivalent arrangements included within the scope of the appended claims.

What is claimed is:

1. A circuit analysis method, comprising:
   executing, by a processor, computer readable program instructions embodied in a non-transitory memory to perform operations comprising:
   building a circuit graph based on a netlist of a circuit;
   defining a node in the circuit graph;
   extracting an X event for the node based on a waveform built as a result of simulation for the node;
   building an X event node from the X event that was extracted;
   building an X event graph by linking the X event node to at least one other X event node;
   traversing the X event graph and identifying a source X event and an involvement X event; and
   finding an X propagation path for the X event node, the X propagation path comprising the source X event and the involvement X event.

2. The circuit analysis method of claim 1, wherein the building of the circuit graph comprises:
   building the circuit graph represented at a gate level based on a logic gate having an input node and an output node based on the netlist of the circuit described at a transistor level based on transistors connected to the input node and the output node.

3. The circuit analysis method of claim 2, wherein the building of the circuit graph further comprises:
   configuring the logic gate, in the netlist of the circuit, by inferring an input/output relationship between the transistors and by identifying a channel connected block (CCB) comprising an electrical block in which channel terminals are electrically connected to each other.

4. The circuit analysis method of claim 1, wherein the extracting of the X event comprises:
   extracting a section in which the X event has occurred from the waveform.

5. The circuit analysis method of claim 1, wherein the building of the X event graph comprises:
   linking the X event node to the at least one other X event node comprising a cause X event node that causes the X event of the X event node to occur.

6. The circuit analysis method of claim 5, wherein the cause X event node is identified by whether there is a preceding X event for the X event node in which the X event has occurred.

7. The circuit analysis method of claim 5, wherein the X event comprises a plurality of X events that were extracted, and wherein the linking of the X event node and the cause X event node is performed for all of the X events that were extracted.

8. The circuit analysis method of claim 1, wherein the identifying of the source X event and the involvement X event comprises:

traversing the X event graph according to a depth first search (DFS) algorithm.

9. The circuit analysis method of claim 8, wherein the traversing of the X event graph comprises:

performing a traversal according to the DFS algorithm for the X event node, wherein the X event node has no input in the X event graph.

10. The circuit analysis method of claim 1, further comprising:

generating a report comprising an analysis result for the source X event, the involvement X event, and the X propagation path.

11. A circuit analysis device, comprising:

a circuit graph building module configured to build a circuit graph based on a netlist of a circuit;

an X event extracting module configured to extract an X event based on a waveform built as a result of simulation for a node defined in the circuit graph;

an X event linking module configured to build an X event node from the X event that was extracted, and link the X event node to at least one other X event node to build an X event graph;

a graph traversing module configured to traverse the X event graph and identify a source X event and an involvement X event; and an X path finding module configured to find an X propagation path for the X event node, the X propagation path comprising the source X event and the involvement X event.

12. The circuit analysis device of claim 11, wherein the circuit graph building module is configured to build the circuit graph represented at a gate level based on a logic gate having an input node and an output node based on the netlist of the circuit described at a transistor level based on transistors connected to the input node and the output node.

13. The circuit analysis device of claim 12, wherein the circuit graph building module is further configured to configure a gate, in the netlist of the circuit, by inferring an input/output relationship between transistors and by identifying a channel connected block (CCB) comprising an electrical block in which channel terminals are electrically connected to each other.

14. The circuit analysis device of claim 11, wherein the X event extracting module is configured to extract a section in which the X event has occurred from the waveform.

15. The circuit analysis device of claim 11, wherein the X event linking module is configured to link the X event node to the at least one other X event node comprising a cause X event node that causes the X event of the X event node to occur.

16. The circuit analysis device of claim 15, wherein the cause X event node is identified by whether there is a preceding X event for the X event node in which the X event has occurred.

17. The circuit analysis device of claim 15, wherein the X event comprises a plurality of X events that were extracted, and wherein the linking of the X event node and the cause X event node is performed for all of the X events that were extracted.

18. The circuit analysis device of claim 11, wherein the graph traversing module is configured to traverse the X event graph according to a depth first search (DFS) algorithm.

19. The circuit analysis device of claim 18, wherein the graph traversing module is further configured to perform a traversal according to the DFS algorithm for the X event node, wherein the X event node has no input in the X event graph.

20. A circuit analysis system, comprising:

a netlist database configured to store a netlist of a circuit;

a simulation database configured to store a waveform built as a result of simulation for a node defined in the circuit; and a circuit analyzing device, wherein the circuit analyzing device comprises:

a circuit graph building module configured to build a circuit graph based on the netlist from the netlist database;

an X event extracting module configured to extract an X event for the node based on the waveform from the simulation database;

an X event linking module configured to build an X event node from the X event that was extracted, and configured to link the X event node to at least one other X event node to build an X event graph;

a graph traversing module configured to traverse the X event graph and configured to identify a source X event and an involvement X event; and an X path finding module configured to find an X propagation path for the X event node, the X propagation path comprising the source X event and the involvement X event.

* * * * *